(12) United States Patent
Yang et al.

(10) Patent No.: US 10,901,471 B2
(45) Date of Patent: Jan. 26, 2021

(54) HEAT DISSIPATION ASSEMBLY AND PORTABLE ELECTRONIC DEVICE

(71) Applicants: INVENTEC (PUDONG) TECHNOLOGY CORPORATION, Shanghai (CN); INVENTEC CORPORATION, Taipei (TW)

(72) Inventors: Chih-Kai Yang, Taipei (TW); Yi-Lun Cheng, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/436,727

(22) Filed: Jun. 10, 2019

(65) Prior Publication Data

US 2020/0319685 A1 Oct. 8, 2020

(30) Foreign Application Priority Data

Apr. 8, 2019 (CN) .......................... 2019 1 0276524

(51) Int. Cl.
 *G06F 1/20* (2006.01)
 *F28D 15/04* (2006.01)
 *H05K 7/20* (2006.01)

(52) U.S. Cl.
 CPC ........... *G06F 1/203* (2013.01); *F28D 15/043* (2013.01); *H05K 7/2099* (2013.01); *H05K 7/20336* (2013.01)

(58) Field of Classification Search
 CPC .. G06F 1/203; H05K 7/2099; H05K 7/20336; F28D 15/043
 See application file for complete search history.

(56) References Cited

U.S. PATENT DOCUMENTS

| | | | | |
|---|---|---|---|---|
| 5,847,925 A | * | 12/1998 | Progl | G06F 1/203 361/679.47 |
| 2009/0260793 A1 | * | 10/2009 | Wang | F28D 15/025 165/181 |
| 2012/0227935 A1 | * | 9/2012 | Huang | B21D 41/04 165/104.26 |
| 2017/0374762 A1 | * | 12/2017 | Cheng | F28D 15/0275 |

* cited by examiner

*Primary Examiner* — Rockshana D Chowdhury
(74) *Attorney, Agent, or Firm* — Maschoff Brennan (57) ABSTRACT

A heat dissipation assembly and portable electronic device including the same wherein heat dissipation assembly includes first heat pipe. The first heat pipe includes first end part and second end part that are opposite to each other. The second end part includes inner peripheral wall and outer peripheral wall surrounding the inner peripheral wall. A vapor channel is formed between the outer peripheral wall and the inner peripheral wall. The inner peripheral wall forms insertion hole. A central line of the insertion hole is at first distance from the outer peripheral wall along first direction. The central line of the insertion hole is at second distance from the outer peripheral wall along second direction. The first direction is different from the second direction, and the first distance is different from the second distance.

19 Claims, 8 Drawing Sheets

HEAT DISSIPATION ASSEMBLY AND PORTABLE ELECTRONIC DEVICE

CROSS-REFERENCE TO RELATED APPLICATIONS

This non-provisional application claims priority under 35 U.S.C. § 119(a) on Patent Application No(s). 201910276524.6 filed in China, on Apr. 8, 2019, the entire contents of which are hereby incorporated by reference.

BACKGROUND OF THE INVENTION

Technical Field of the Invention

The disclosure relates to a heat dissipation assembly and a portable electronic device, more particularly to a heat dissipation assembly including a heat pipe that has an insertion hole and a portable electronic device including heat pipes that are able to be sleeved with each other.

Description of the Related Art

As the processing speed and performance of an electronic device such as central processing unit (CPU) progress, a large amount of heat is generated during operation. The heat needs to be removed as soon as possible; otherwise the electronic device's internal temperature will increase. If the electronic device gets too hot internally, its internal circuits can be damaged. For a slim and compact portable electronic product, such as a laptop computer, it has a very limited internal space so there is no room for air cooling devices. Therefore, some use heat pipes as an efficient heat transfer component for heat dissipation. Specifically, there are two heat pipes partially sleeved with each other and thermally respectively connected to a heat source and a display casing so that the heat generated from the heat source can be transferred to the display casing and dissipated to the environment.

SUMMARY OF THE INVENTION

One embodiment of this disclosure provides a heat dissipation assembly including a first heat pipe. The first heat pipe includes a first end part and a second end part that are opposite to each other. The second end part includes an inner peripheral wall and an outer peripheral wall surrounding the inner peripheral wall. A vapor channel is formed between the outer peripheral wall and the inner peripheral wall. The inner peripheral wall forms an insertion hole. A central line of the insertion hole is at a first distance from the outer peripheral wall along a first direction. The central line of the insertion hole is at a second distance from the outer peripheral wall along a second direction. The first direction is different from the second direction and the first distance is different from the second distance.

Another embodiment of this disclosure provides a portable electronic device including a host body, a display body and a heat dissipation assembly. The host body includes a base and a heat source, and the heat source is disposed on the base. The display body includes a metal casing and a display panel disposed in the metal casing. The metal casing is pivotably connected to the base so that the metal casing is pivotable to the base. The heat dissipation assembly includes a first heat pipe and a second heat pipe. The first heat pipe includes a first end part and a second end part that are opposite to each other. The second end part includes an inner peripheral wall and an outer peripheral wall surrounding the inner peripheral wall. A vapor channel is formed between the outer peripheral wall and the inner peripheral wall. The inner peripheral wall forms an insertion hole. The second heat pipe has an end part pivotably inserted into the insertion hole and in thermal contact with the inner peripheral wall of the first heat pipe. The metal casing and the heat source are in thermal contact with each other via the first heat pipe and the second heat pipe. A central line of the insertion hole is at a first distance from the outer peripheral wall along a first direction. The central line of the insertion hole is at a second distance from the outer peripheral wall along a second direction. The first direction is different from the second direction, and the first distance is different from the second distance.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
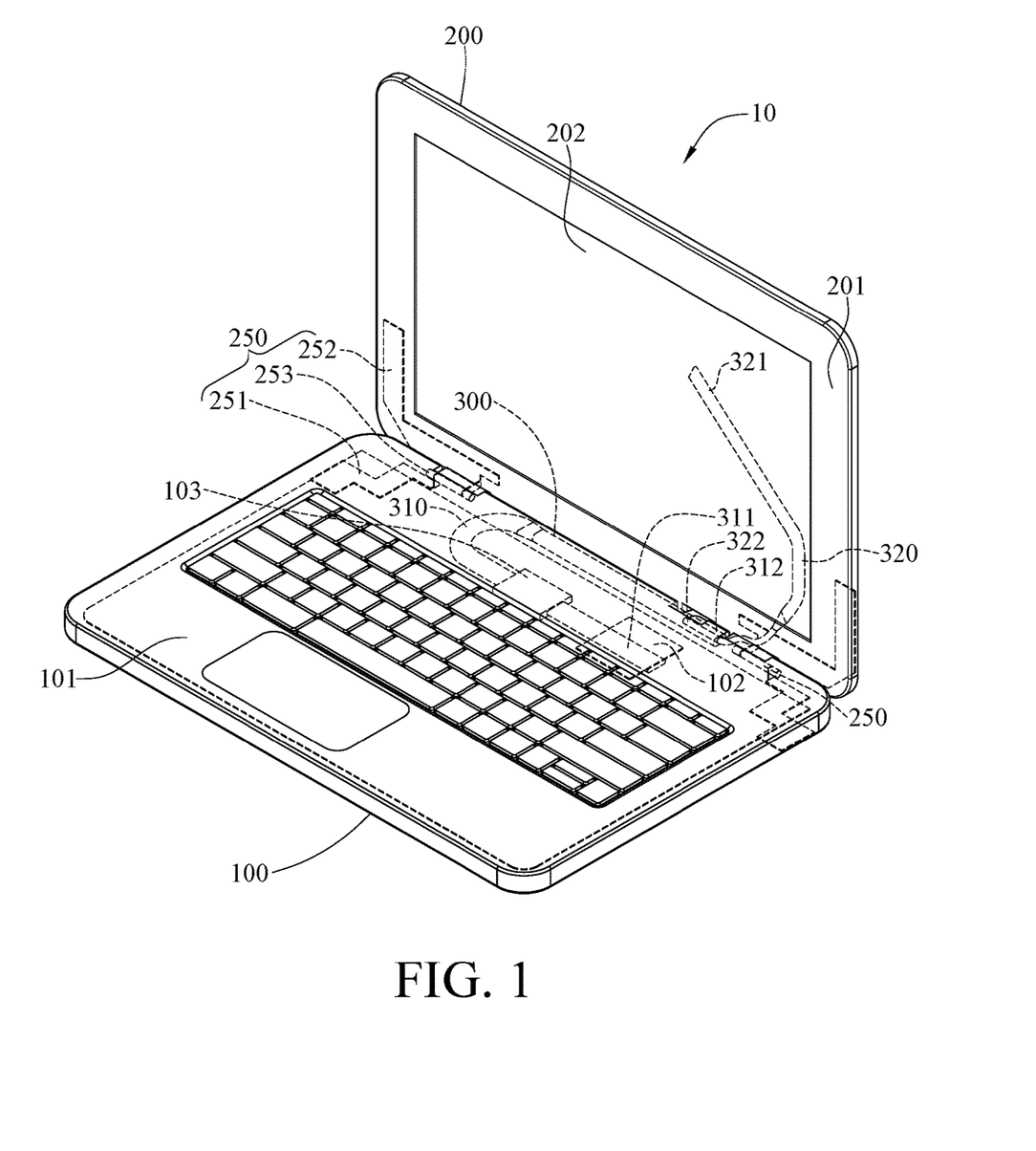
FIG. 1 is a perspective view of a portable electronic device according to a first embodiment of the disclosure.

Please refer to FIG. 1. FIG. 1 is a perspective view of a portable electronic device according to a first embodiment of the disclosure.

This embodiment provides a portable electronic device 10 including a host body 100, a display body 200, two hinges 250, and a heat dissipation assembly 300.

The host body 100 includes a base 101, a heat source 102, and a heat dissipation component 103. The heat source 102 is disposed in the base 101 and may be a central processing unit. The heat dissipation component 103 is disposed in the base 101.

The display body 200 includes a metal casing 201 and a display panel 202. The metal casing 201 is pivotably connected to the base 101 via the hinges 250 so that the metal casing 201 can be pivoted relative to the base 101, allowing the user to close or open the portable electronic device 10. The display panel 202 is disposed on the metal casing 201.

In detail, each hinge 250 has a single axis and includes a first mounting part 251, a second mounting part 251, and a pivot 253. In each hinge 250, the first mounting part 251 is fixed to the base 101 of the host body 100, the second mounting part 251 is fixed to the metal casing 201 of the display body 200, and both the first mounting part 251 and the second mounting part 251 are pivotably connected to the pivot 253, such that the first mounting part 251 and the second mounting part 251 can be pivoted relative to each other. This allows the display body 200 and the host body 100 to be pivoted relative to each other. However, the hinge 250 is an example of how the display body and the host body are pivotably connected. It is noted that the configuration of the hinge may be varied in other embodiments. Alternatively, in some embodiments, the portable electronic device may not have the aforementioned hinges, and it is noted that any suitable means that allows the display body and the host body to pivot relative to each other can be applied to the disclosure.

Figure 2:
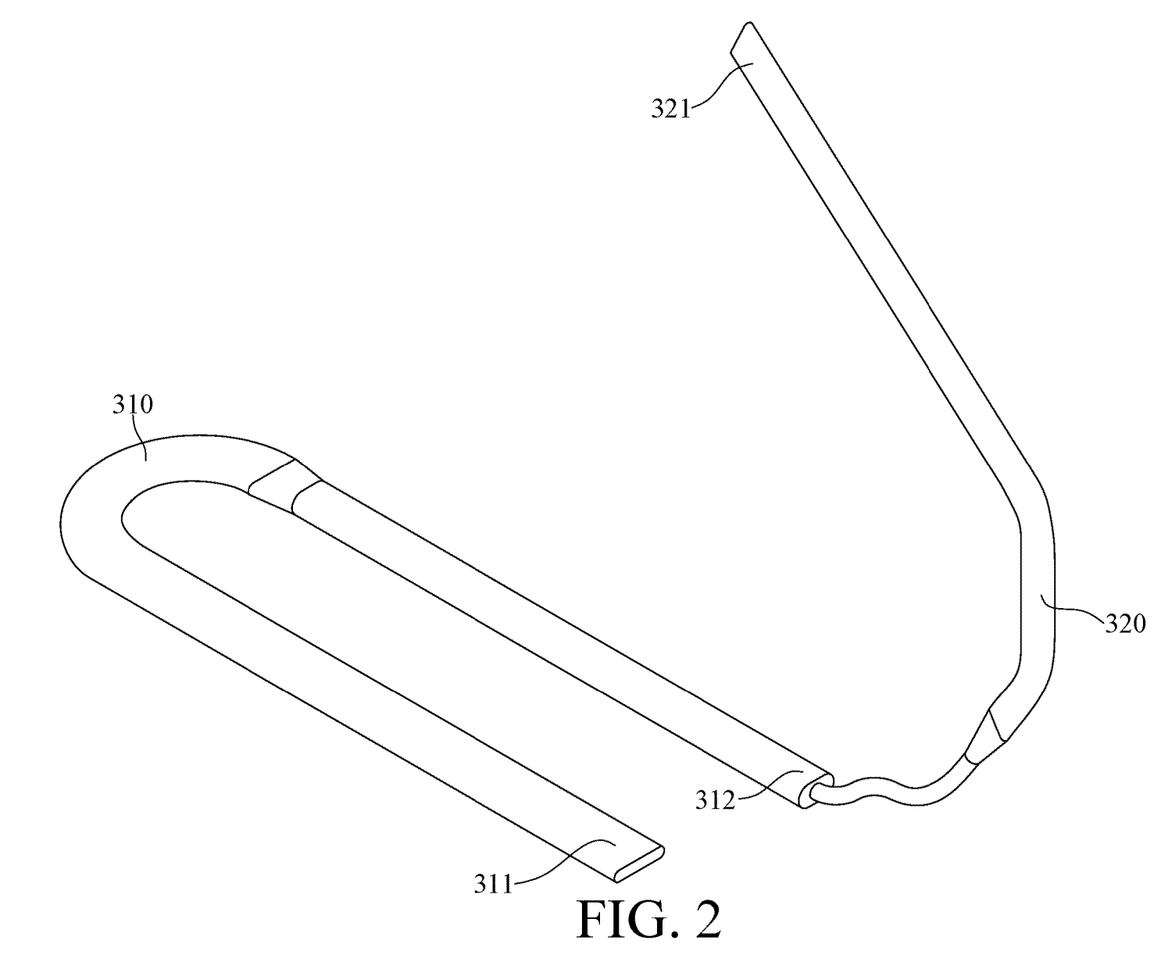
FIG. 2 is a perspective view of a heat dissipation assembly of the portable electronic device according to the first embodiment of the disclosure.
Figure 3:
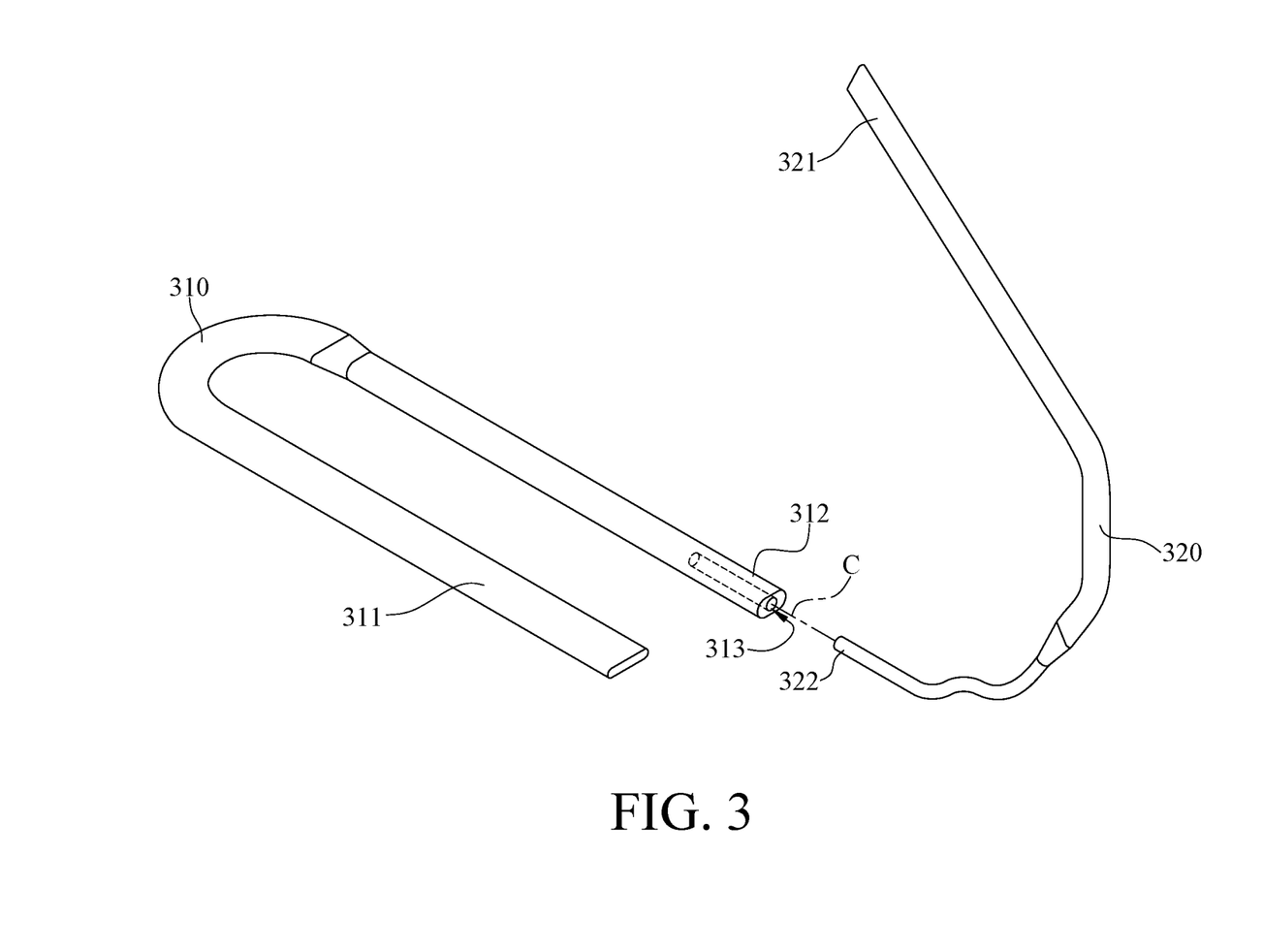
FIG. 3 is an exploded view of the heat dissipation assembly in FIG. 2.
Figure 4:
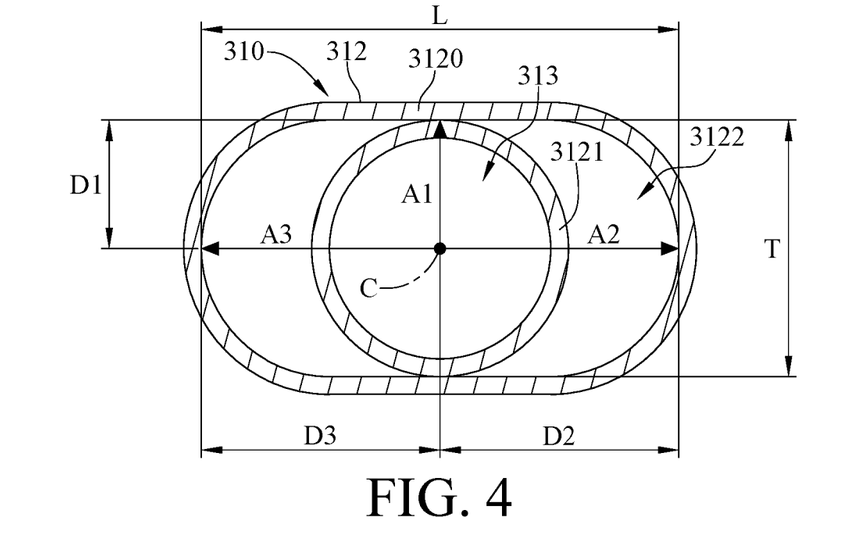
FIG. 4 is a cross-sectional side view of a second end part of a first heat pipe of the portable electronic device according to the first embodiment of the disclosure taken along a radial direction of a first heat pipe.
Figure 5:
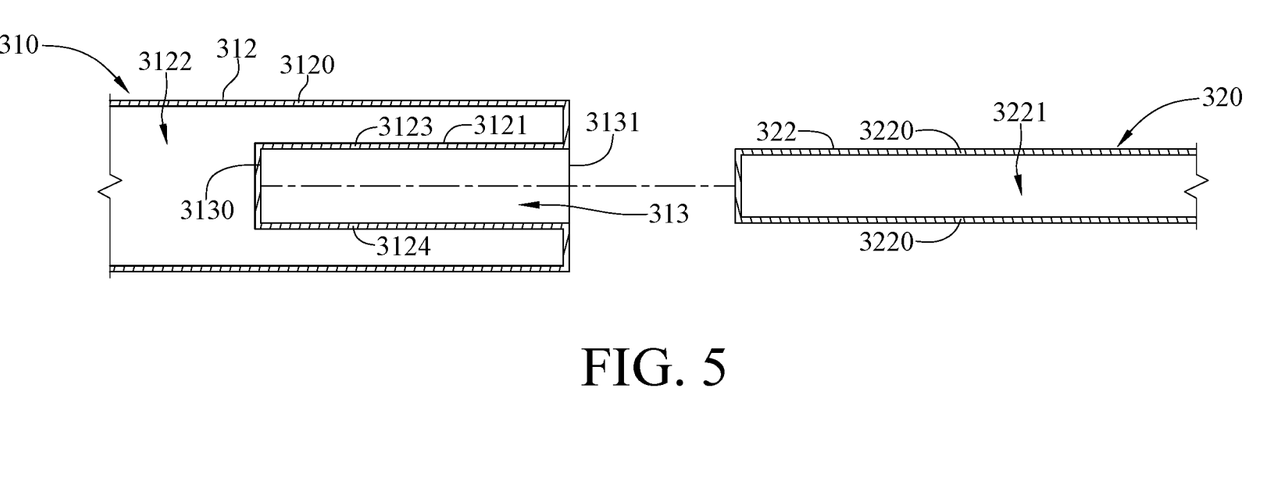
FIG. 5 is a partially enlarged cross-sectional top view of the heat dissipation assembly in FIG. 3 taken along axial directions of the first heat pipe and a second heat pipe.

Please refer to FIG. 2 to FIG. 5. FIG. 2 is a perspective view of a heat dissipation assembly of the portable electronic device according to the first embodiment of the disclosure. FIG. 3 is an exploded view of the heat dissipation assembly in FIG. 2. FIG. 4 is a cross-sectional side view of a second end part of a first heat pipe of the portable electronic device according to the first embodiment of the disclosure taken along a radial direction of a first heat pipe. FIG. 5 is a partially enlarged cross-sectional top view of the heat dissipation assembly in FIG. 3 taken along axial directions of the first heat pipe and a second heat pipe.

The heat dissipation assembly 300 includes a first heat pipe 310 and a second heat pipe 320. The first heat pipe 310 has a first end part 311 and a second end part 312 that are opposite to each other. The first end part 311 may be in thermal contact with the heat source 102, and the first heat pipe 310 may be in thermal contact with the heat dissipation component 103 (as shown in FIG. 1). The second end part 312 includes an inner peripheral wall 3121 and a first outer peripheral wall 3120 surrounding the inner peripheral wall 3121. The inner peripheral wall 3121 contacts the first outer peripheral wall 3120. There is a first vapor channel 3122 formed between the first outer peripheral wall 3120 and the inner peripheral wall 3121, where the first vapor channel 3122 is a space for the heat dissipation fluid (not shown) to flow in the first heat pipe 310. The inner peripheral wall 3121 forms an insertion hole 313, and the insertion hole 313 has a closed end 3130 and an open end 3131 that are opposite to each other.

As shown in FIG. 4, a shape of the radial cross section of the insertion hole 313 may be circular, and the first outer peripheral wall 3120 may include two straight parts (not labeled) and two arc parts (not labeled) so that a shape of the radial cross section of the first outer peripheral wall 3120 is non-circular. In more detail, a central line C of the insertion hole 313 is at a first distance D1 from the first outer peripheral wall 3120 along a first direction A1, the central line C of the insertion hole 313 is at a second distance D2 from the first outer peripheral wall 3120 along a second direction A2, and the central line C of the insertion hole 313 is at a third distance D3 from the first outer peripheral wall 3120 along a third direction A3, where the first direction A1 may be perpendicular to the second direction A2, and the third direction A3 may be opposite to the second direction A2. The first distance D1 is different from the second distance D2. As shown in FIG. 4, an internal width L of the second end part 312 taken along the second direction A2 or third direction A3 is different from another internal width T of the second end part 312 taken along the first direction A1. The internal width T denotes the distance between the two straight parts of the first outer peripheral wall 3120, and the internal width L denotes the maximum distance between the two arc parts of the first outer peripheral wall 3120. If the second distance D2 is the same as the third distance D3, the insertion hole 313 will be determined to be located on the geometry center of the first outer peripheral wall 3120.

However, the first direction A1 is not limited to be perpendicular to the second direction A2. For example, in other embodiments, the first direction may have an acute angle to the second direction, and the central line of the insertion hole is still at different distances from the first outer peripheral wall respectively along the first and second directions.

The second heat pipe 320 has a third end part 321 and a fourth end part 322 that are opposite to each other. The third end part 321 may be in thermal contact with the metal casing 201 (as shown in FIG. 1). The fourth end part 322 is configured to be pivotably inserted into the insertion hole 313 so as to be in thermal contact with the first heat pipe 310. In this embodiment, a shape of a radial cross section of the fourth end part 322 may be circular, and the fourth end part 322 includes two opposite second outer peripheral walls 3220. There is a second vapor channel 3221 formed between the two second outer peripheral walls 3220, where the second vapor channel 3221 is a space for the heat dissipation fluid (not shown) to flow in the second heat pipe 320.

In addition, as shown in FIG. 5, in this embodiment, the maximum distance between a first portion 3123 and a second portion 3124 of the inner peripheral wall 3121 is fixed from the closed end 3130 to the open end 3131, and the maximum distance between the second outer peripheral walls 3220 of the fourth end part 322 is also fixed from end to end.

It is noted that the first end part 311 of the first heat pipe 310 is not limited to be in thermal contact with the heat source 102, and the third end part 321 of the second heat pipe 320 is either not limited to be connected to the metal casing 201. In other embodiments, the first end part of the first heat pipe may be connected to the metal casing, and the third end part of the second heat pipe may be in thermal contact with the heat source.

Furthermore, the distance between the closed end 3130 and the open end 3131 of the insertion hole 313 is not particularly limited.

Figure 6:
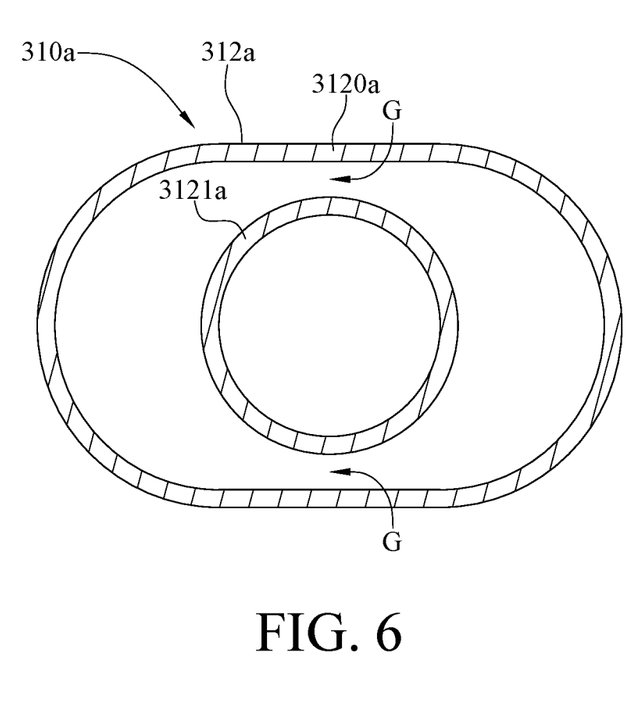
FIG. 6 is a cross-sectional side view of a second end part of a first heat pipe of a portable electronic device according to a second embodiment of the disclosure.

The first outer peripheral wall is not limited to contact the inner peripheral wall, please refer to FIG. 6, FIG. 6 shows a cross-sectional side view of a second end part of a first heat pipe of a portable electronic device according to a second embodiment of the disclosure. One of differences between the previous embodiments and this embodiment is the position of the first outer peripheral wall relative to the inner peripheral wall. For the purpose of brevity, the descriptions of the same or similar parts of these embodiments are omitted and can be referred to the previous embodiments. In this embodiment, an inner peripheral wall 3121a of a second end part 312a of a first heat pipe 310a is not in contact with a first outer peripheral wall 3120a of a second end part 312a. As shown in FIG. 6, there is a gap G between the first outer peripheral wall 3120a of the second end part 312a and the inner peripheral wall 3121a.

Figure 7A:
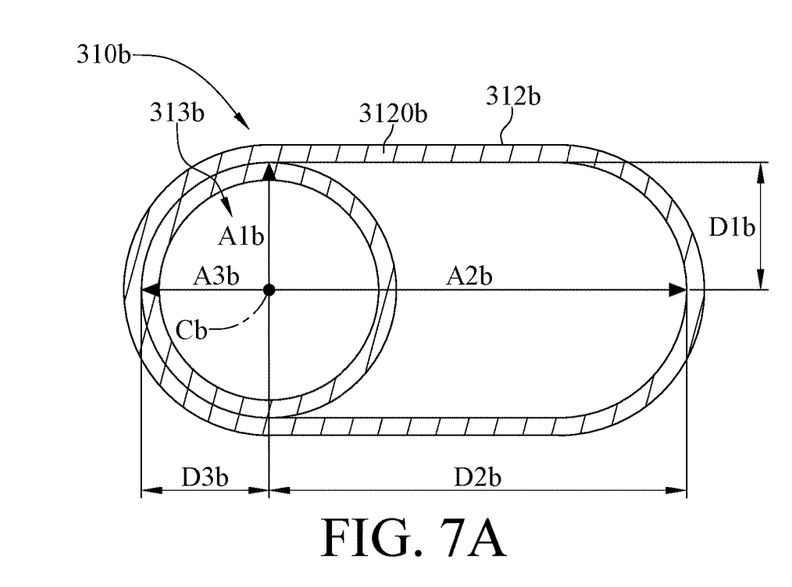
FIG. 7A is a cross-sectional side view of a second end part of a first heat pipe of a portable electronic device according to a third embodiment of the disclosure.
Figure 7B:
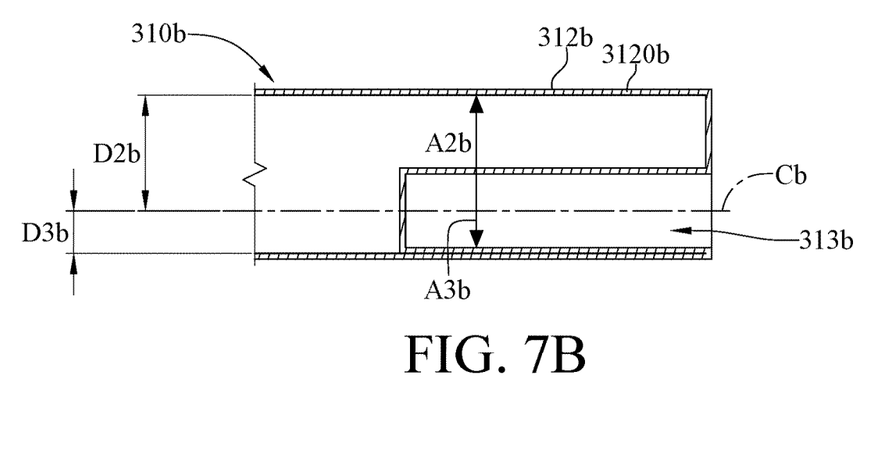
FIG. 7B is a partially enlarged cross-sectional top view of the first heat pipe of the portable electronic device according to the third embodiment of the disclosure.

The insertion hole is not limited to be located on the geometry center of the first outer peripheral wall. Please refer to FIG. 7A and FIG. 7B. FIG. 7A is a cross-sectional side view of a second end part of a first heat pipe of a portable electronic device according to a third embodiment of the disclosure. FIG. 7B is a partially enlarged cross-sectional top view of the first heat pipe of the portable electronic device according to the third embodiment of the disclosure. One of differences between the previous embodiments and this embodiment is the configuration of the second end part. For the purpose of brevity, the descriptions of the same or similar parts of these embodiments are omitted and can be referred to the previous embodiments. In this embodiment, in a second end part 312b of the first heat pipe 310b, a central line Cb of an insertion hole 313b is at a first distance D1b from a first outer peripheral wall 3120b along a first direction A1b, the central line Cb of the insertion hole 313b is at a second distance D2b from the first outer peripheral wall 3120b along a second direction A2b, the central line Cb of the insertion hole 313b is at a third distance D3b from the first outer peripheral wall 3120b along a third direction A3b, where the first direction Alb is perpendicular to the second direction A2b, the third direction A3b is opposite to the second direction A2b, and the second distance D2b is different from the third distance D3b. That is, in this embodiment, the insertion hole 313b is not located on the geometry center of the first outer peripheral wall 3120b.

Figure 8:
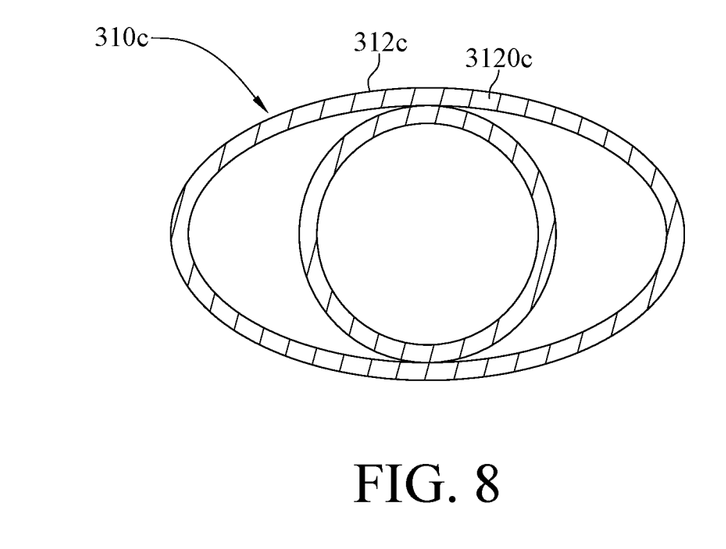
FIG. 8 is a cross-sectional side view of a second end part of a first heat pipe of a portable electronic device according to a fourth embodiment of the disclosure.

In addition, the shape of the first outer peripheral wall is not particularly limited. Please refer to FIG. 8. FIG. 8 is a cross-sectional side view of a second end part of a first heat pipe of a portable electronic device according to a fourth embodiment of the disclosure. One of differences between the previous embodiments and this embodiment is the shape of the first outer peripheral wall. For the purpose of brevity, the descriptions of the same or similar parts of these embodiments are omitted and can be referred to the previous embodiments. In this embodiment, a shape of a radial cross section of a first outer peripheral wall 3120c of a second end part 312c of a first heat pipe 310c may be ecliptic so that the first outer peripheral wall 3120c has non-circular radial cross section.

Figure 9:
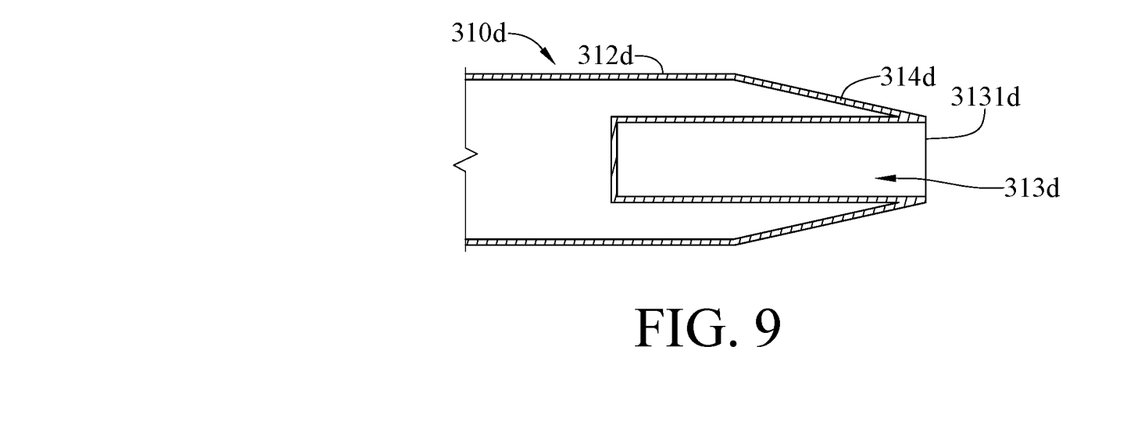
FIG. 9 is a partially enlarged cross-sectional top view of a first heat pipe of a portable electronic device according to a fifth embodiment of the disclosure.

Furthermore, please refer to FIG. 9. FIG. 9 is a partially enlarged cross-sectional top view of a first heat pipe of a portable electronic device according to a fifth embodiment of the disclosure. One of differences between the previous embodiments and this embodiment is the shape of the first heat pipe. For the purpose of brevity, the descriptions of the same or similar parts of these embodiments are omitted and can be referred to the previous embodiments. In this embodiment, a second end part 312d of a first heat pipe 310d has a tapered structure 314d tapered towards an open end 3131d of an insertion hole 313d.

Figure 10:
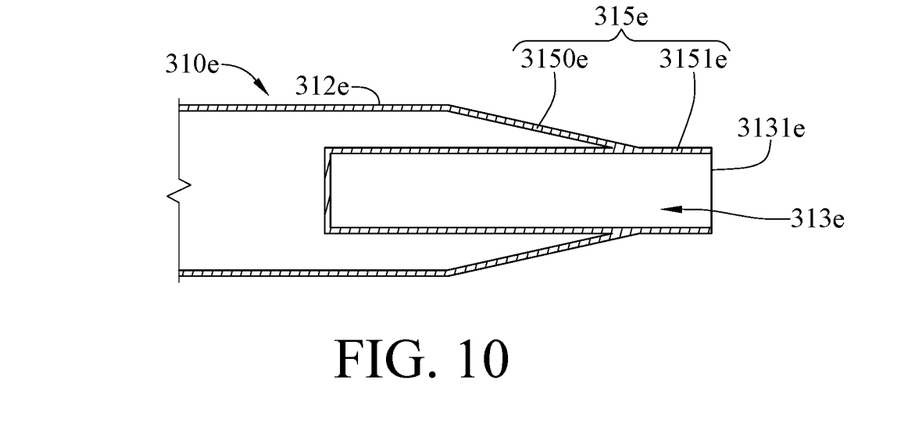
FIG. 10 is partially enlarged cross-sectional top view of a first heat pipe of a portable electronic device according to a sixth embodiment of the disclosure.

Please refer to FIG. 10. FIG. 10 is partially enlarged cross-sectional top view of a first heat pipe of a portable electronic device according to a sixth embodiment of the disclosure. One of differences between the previous embodiments and this embodiment is the configuration of the first heat pipe. For the purpose of brevity, the descriptions of the same or similar parts of these embodiments are omitted and can be referred to the previous embodiments. In this embodiment, a second end part 312e of a first heat pipe 310e has a protrusion 315e. In detail, the protrusion 315e includes a tapered part 3150e and a distal part 3151e, the tapered part 3150e is tapered towards an open end 3131e of an insertion hole 313e, and the distal part 3151e extends from the tapered part 3150e and is an extension of the insertion hole 313e.

Figure 11:
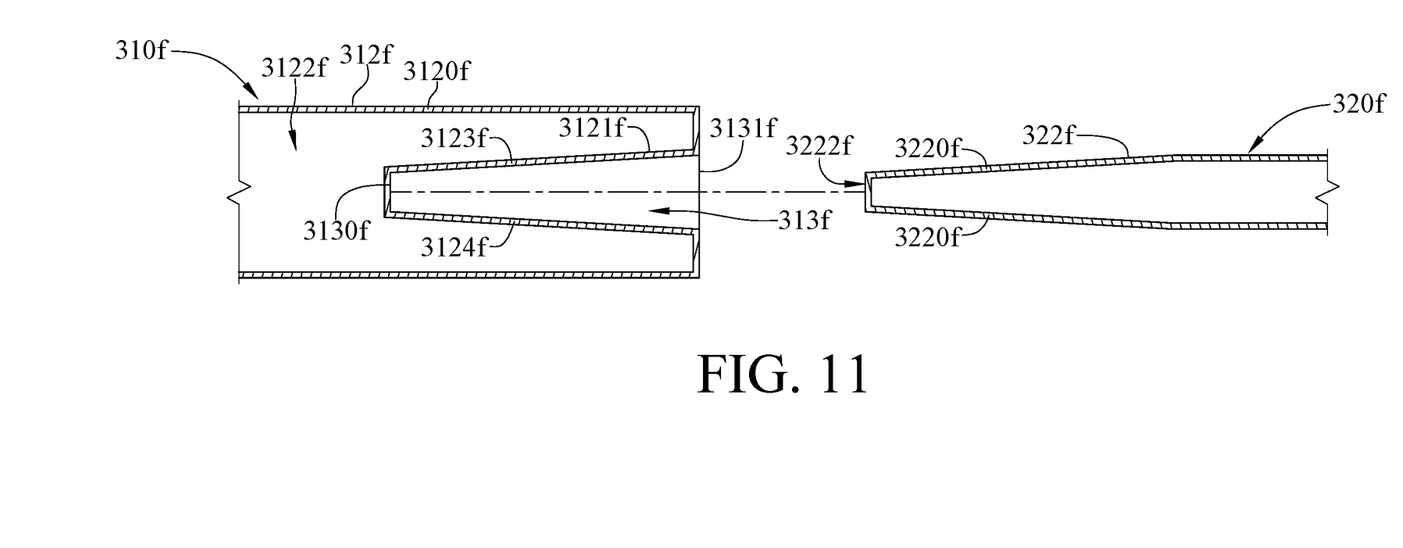
FIG. 11 is a partially enlarged cross-sectional top view of a heat dissipation assembly of a portable electronic device according to a seventh embodiment of the disclosure.

In addition, the disclosure is not limited by the shapes of the insertion hole and the fourth end part of second heat pipe. Please refer to FIG. 11. FIG. 11 is a partially enlarged cross-sectional top view of a heat dissipation assembly of a portable electronic device according to a seventh embodiment of the disclosure. One of differences between previous embodiments and this embodiment is the configurations of the second end part and the fourth end part. For the purpose of brevity, the descriptions of the same or similar parts of these embodiments are omitted and can be referred to the previous embodiments.

In this embodiment, in a second end part 312f of a first heat pipe 310f, a first vapor channel 3122f is formed between an inner peripheral wall 3121f and a first outer peripheral wall 3120f, and an insertion hole 313f is formed by the inner peripheral wall 3121f. The maximum distance between a first portion 3123f and a second portion 3124f of the inner peripheral wall 3121f decreases from an open end 3131f of an insertion hole 313f to a closed end 3130f of the insertion hole 313f; that is, the insertion hole 313f is tapered towards the closed end 3130f of the insertion hole 313f. In addition, in a fourth end part 322f of the second heat pipe 320f, the maximum distance between two opposite second outer peripheral walls 3220f decreases toward an end surface 3222f of the fourth end part 322f. That is to say, the fourth end part 322f is tapered toward the end surface 3222f. The insertion hole 313f and the fourth end part 322f are not limited to both be tapered; in other embodiments, only one of the fourth end part of the second heat pipe and the insertion hole is tapered.

According to the heat dissipation assembly and the portable electronic device discussed above, the central line of the insertion hole of the first heat pipe is at different distances from the outer peripheral wall of the first heat pipe along different radial directions, that is, the insertion hole of the first heat pipe is at different distances from different parts taken at the same radial section of the outer peripheral wall of the first heat pipe. This enables the first heat pipe to have a flat shape at the second end part, allowing the heat pipe to be placed in a portable electronic device with very limited height. Also, the vapor channel of the first heat pipe between the inner peripheral wall and the first outer peripheral wall still has a certain volume for effectively transferring the heat dissipation fluid. Therefore, the heat dissipation assembly is suitable for slim and compact electronic device and yet powerful in heat dissipation.

In addition, in some embodiments, the insertion hole formed by the inner peripheral wall of the second end part of the first heat pipe is tapered toward its closed end, so the part of the vapor channel near the closed end of the insertion hole has a larger volume for more working fluid to flow into the area between the inner peripheral wall and the outer peripheral wall of the first heat pipe and towards the open end of the insertion hole. This causes the temperature of the working fluid in the area between the inner peripheral wall and the outer peripheral wall of the first heat pipe to become more uniform and thus improving the heat transfer from the first heat pipe to the second heat pipe.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation assembly, comprising:
    a first heat pipe, comprising a first end part and a second end part that are opposite to each other, the second end part comprising an inner peripheral wall and an outer peripheral wall surrounding the inner peripheral wall, a vapor channel formed between the outer peripheral wall and the inner peripheral wall, and the inner peripheral wall forming an insertion hole;
    wherein a central line of the insertion hole is at a first distance from the outer peripheral wall along a first direction, the central line of the insertion hole is at a second distance from the outer peripheral wall along a second direction, the first direction is different from the second direction, and the first distance is different from the second distance;
    wherein the heat dissipation assembly further comprises a second heat pipe, the second heat pipe has an end part configured to be pivotably inserted into the insertion hole and in thermal contact with the inner peripheral wall of the first heat pipe;
    wherein the insertion hole has a closed end and an open end that are opposite to each other, the end part of the second heat pipe is tapered towards an end surface of the end part of the second heat pipe, and the insertion hole is tapered from the open end to the closed end.

2. The heat dissipation assembly according to claim 1, wherein a shape of a radial cross section of the insertion hole is circular.

3. The heat dissipation assembly according to claim 1, wherein a shape of a radial cross section of the outer peripheral wall is non-circular.

4. The heat dissipation assembly according to claim 1, wherein the outer peripheral wall contacts the inner peripheral wall.

5. The heat dissipation assembly according to claim 1, wherein the outer peripheral wall and the inner peripheral wall are not in contact with each other.

6. The heat dissipation assembly according to claim 1, wherein the first direction is perpendicular to the second direction.

7. The heat dissipation assembly according to claim 6, wherein the central line of the insertion hole is at a third distance from the outer peripheral wall along a third direction, the third direction is opposite to the second direction, and the third distance is different from the second distance.

8. The heat dissipation assembly according to claim 1, wherein the second end part has a tapered structure tapered towards an open end of the insertion hole.

9. The heat dissipation assembly according to claim 1, wherein the second end part has a protrusion, the protrusion comprises a tapered part and a distal part, the tapered part is tapered toward an open end of the insertion hole, and the distal part extends from the tapered part.

10. A portable electronic device, comprising:
    a host body, comprising a base and a heat source, and the heat source disposed on the base;
    a display body, comprising a metal casing and a display panel disposed on the metal casing, and the metal casing pivotably connected to the base so that the metal casing is pivotable to the base; and
    a heat dissipation assembly, comprising a first heat pipe and a second heat pipe, the first heat pipe comprising a first end part and a second end part that are opposite to each other, the second end part comprising an inner peripheral wall and an outer peripheral wall surrounding the inner peripheral wall, a vapor channel formed between the outer peripheral wall and the inner peripheral wall, and the inner peripheral wall forming an insertion hole, the second heat pipe having an end part pivotably inserted into the insertion hole and in thermal contact with the first heat pipe, and the metal casing and the heat source in thermal contact with each other via the first heat pipe and the second heat pipe;
    wherein, a central line of the insertion hole is at a first distance from the outer peripheral wall along a first direction, the central line of the insertion hole is at a second distance from the outer peripheral wall along a second direction, the first direction is different from the second direction, and the first distance is different from the second distance;
    wherein the insertion hole has a closed end and an open end that are opposite to each other, the end part of the second heat pipe is tapered toward an end surface of the end part of the second heat pipe, and the insertion hole is tapered from the open end to the closed end.

11. The portable electronic device according to claim 10, wherein the first end part is in thermal contact with the heat source, and another end part of the second heat pipe is connected to the metal casing.

12. The portable electronic device according to claim 10, wherein a shape of a radial cross section of the insertion hole is circular.

13. The portable electronic device according to claim 10, wherein a shape of a radial cross section of the outer peripheral wall is non-circular.

14. The portable electronic device according to claim 10, wherein the outer peripheral wall contacts the inner peripheral wall.

15. The portable electronic device according to claim 10, wherein the outer peripheral wall and the inner peripheral wall are not in contact with each other.

16. The portable electronic device according to claim 10, wherein the first direction is perpendicular to the second direction.

17. The portable electronic device according to claim 16, wherein the central line of the insertion hole is at a third distance from the outer peripheral wall along a third direction, the third direction is opposite to the second direction, and the third distance is different from the second distance.

18. The portable electronic device according to claim 10, wherein the second end part has a tapered structure tapered towards an open end of the insertion hole.

19. The portable electronic device according to claim 10, wherein the second end part has a protrusion, the protrusion comprises a tapered part and a distal part, the tapered part is tapered toward an open end of the insertion hole, and the distal part extends from the tapered part.

* * * * *